(12) United States Patent
Slonim et al.

(10) Patent No.: US 7,194,721 B1
(45) Date of Patent: *Mar. 20, 2007

(54) COST-INDEPENDENT CRITICALITY-BASED MOVE SELECTION FOR SIMULATED ANNEALING

(75) Inventors: Victor Z. Slonim, Broomfield, CO (US); Salim Abid, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 352 days.

This patent is subject to a terminal disclaimer.

(21) Appl. No.: 10/868,956

(22) Filed: Jun. 15, 2004

(51) Int. Cl.
*G06F 17/50* (2006.01)

(52) U.S. Cl. .............................. 716/16; 716/17; 716/18

(58) Field of Classification Search .................... 716/2, 716/16–18
See application file for complete search history.

(56) References Cited

U.S. PATENT DOCUMENTS

| | | | |
|---|---|---|---|
| 6,289,496 B1 * | 9/2001 | Anderson et al. ............. | 716/16 |
| 6,779,169 B1 * | 8/2004 | Singh et al. .................. | 716/16 |
| 6,871,328 B1 * | 3/2005 | Fung et al. ..................... | 716/1 |

OTHER PUBLICATIONS

Jimmy Lam et al.; "Performance of a New Annealing Schedule"; 1988 IEEE, 25th ACM/IEEE Design Automation Conference; Paper 22.1; pp. 306-311.
M. D. Huang et al.; "An Efficient General Cooling Schedule for Simulated Annealing"; 1986 IEEE; pp. 381-384.
Juan De Vicente et al.; "FPGA Placement by Thermodynamic Combinatorial Optimization"; 2002 IEEE; Proceedings of the 2002 Design, Automation and Test in Europe Conference and Exhibition; pp. 1-7.
Naveed Sherwani; "Algorithms for VLSI Physical Design Automation"; Third Edition; Published by Kluwer Academic Publishers; Copyright 1999; fourth printing 2002; pp. 226-229/.

* cited by examiner

*Primary Examiner*—Paul Dinh
(74) *Attorney, Agent, or Firm*—Pablo Meles; Kevin Cuenot

(57) ABSTRACT

A method of physical design for a programmable logic device (PLD) can include associating movable objects of the PLD with a criticality measure that is dependent upon timing information for a configuration of the PLD (115). The method further can include calculating the criticality measure for each movable object (125) and calculating a probability for each movable object (130). The probability can depend upon the criticality measure for the movable object. The method also can include selecting one or more of the movable objects for controlled move generation within a simulated annealing process (135). Movable objects are selected for controlled move generation according to the probabilities assigned to the movable objects.

19 Claims, 1 Drawing Sheet

COST-INDEPENDENT CRITICALITY-BASED MOVE SELECTION FOR SIMULATED ANNEALING

BACKGROUND

1. Field of the Invention

This invention relates to the field of programmable logic devices and, more particularly, to the use of simulated annealing to optimize such devices.

2. Description of the Related Art

Simulated annealing is an optimization technique frequently used with respect to the physical design of programmable logic devices (PLD's). As simulated annealing can be used to solve combinatorial optimization problems, the technique is commonly used to perform tasks such as partitioning, floorplanning, and placement for field programmable gate arrays (FPGA's).

The technique seeks to explore multi-dimensional solution spaces to find an optimal solution through random generation of new combinatorial configurations. To generate a new configuration, an old or previous configuration is shuffled at random. For example, the configuration can be shuffled by displacing an object to a random location, exchanging locations of two or more objects, or performing other adjustments to the design that can affect a cost function. The cost function serves as a means of evaluating the quality of the proposed solution or move in view of predetermined design constraints.

Each configuration, such as a proposed placement solution, can be accepted or rejected based upon an evaluation of the cost function. If a decrease in the cost function occurs, the new configuration is accepted. Otherwise, the new configuration can be accepted with a probability that depends upon "temperature".

As simulated annealing was inspired through an analogy with the cooling of metals, the iterative process is regulated by a cooling schedule that dictates temperature. The cooling schedule specifies an initial temperature, a final temperature, and a function for changing the temperature which restricts the allowable moves in the annealing process as the temperature decreases. Accordingly, the exploration of different placement solutions is stressed at high temperatures, while the convergence to a particular solution is stressed at lower temperatures.

Though simulated annealing can provide high quality solutions for PLD designs, the process requires significant computational resources. To overcome this need, various techniques for reducing the amount of time and computing resources required have been proposed. These approaches have addressed controlled move generation, i.e. the selection of an object to move and a target location, parallel implementation of simulated annealing, and cooling schedule improvements.

Conventional simulated annealing techniques operate such that each movable object has an equal likelihood of being selected for displacement for controlled move generation. This probability can be expressed as: $Pr(i)=1/N$, where N is the total number of identical objects and $$\sum_{i=1}^{N} Pr(i) = 1.$$

The target location also is selected among all available locations with equal probability, at least within a range limited area.

One proposed solution has been to evaluate the historical contribution of moving a particular object in light of changes to the cost function. For example, a histogram of cost function contribution for each object can be stored and evaluated. Objects having a history indicative of improvements to the cost function as a result of displacement can be favored over other objects during selection for controlled move generation. By increasing the probability that objects having a favorable histogram are selected, the likelihood of converging upon a solution more rapidly is increased.

Still, this solution does not take into account device specific design considerations such as congestion, timing delay, and the like. Accordingly, it would be beneficial to provide a technique for simulated annealing that encourages selection of objects and/or target locations for controlled move generation with respect to design considerations. It would further be beneficial to provide a technique for selecting objects and/or target locations that is independent of the cost function.

SUMMARY OF THE INVENTION

The present invention provides a method, system, and apparatus for performing simulated annealing of a design for a programmable logic device (PLD). In one embodiment of the present invention, a criticality measure is used, at least in part, to select a movable object for controlled move generation. In another embodiment, the criticality measure can depend upon design parameters, such as those specific to the design and implementation of field programmable gate array (FPGA) devices.

One embodiment of the present invention can include a method of physical design for a PLD. The method can include associating movable objects of the PLD with a criticality measure that is dependent upon timing information for a configuration of the PLD. The method further can include calculating the criticality measure for each movable object and calculating a probability for each movable object. The probability can depend upon the criticality measure for the movable object. The method also can include selecting one or more of the movable objects for controlled move generation within a simulated annealing process. Movable objects are selected for controlled move generation according to the probabilities assigned to the movable objects.

Other embodiments of the present invention can include a machine readable storage that has been programmed to cause a machine to perform the steps disclosed herein as well as a system having means for performing the various steps described herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
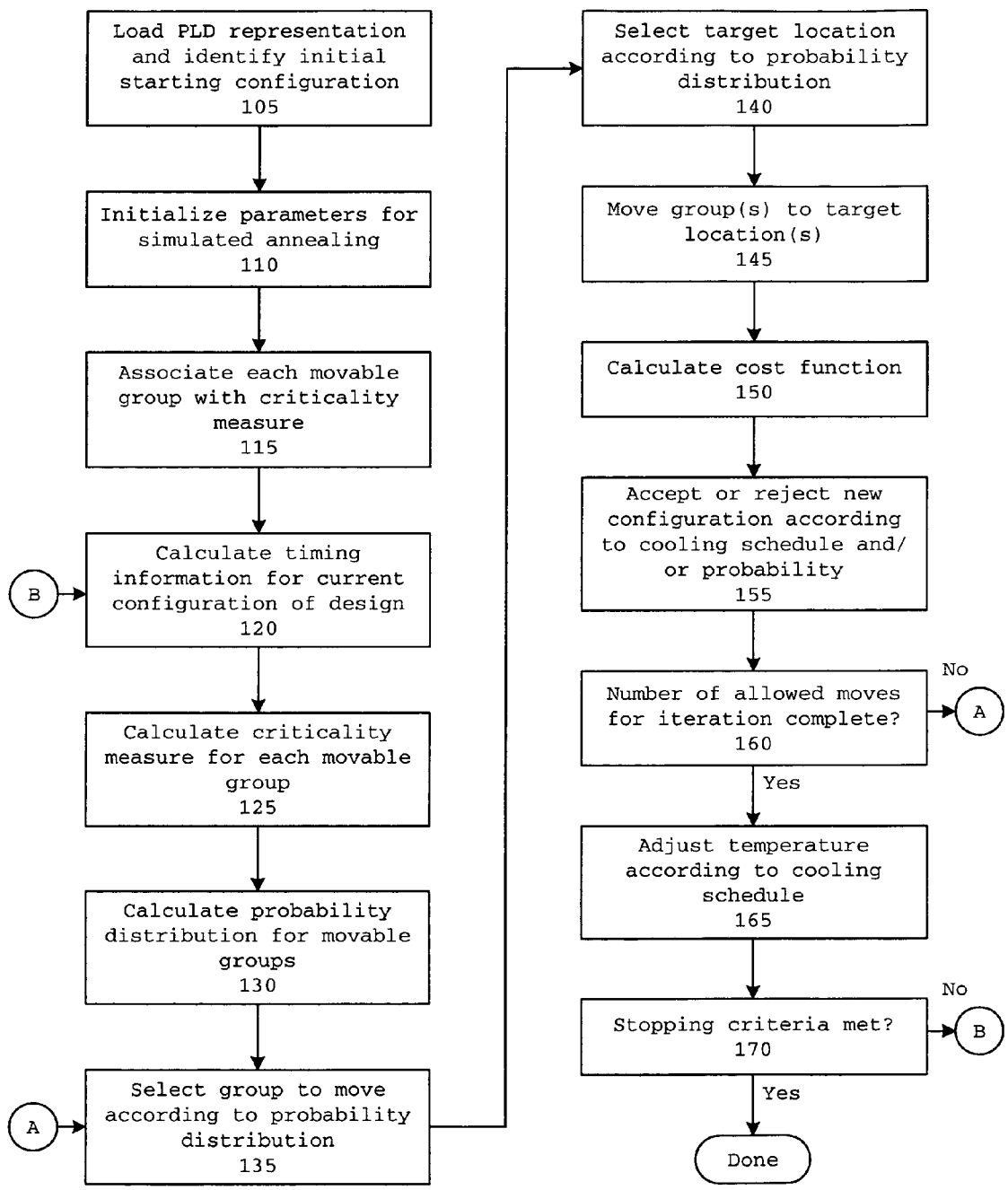
FIG. 1 is a flow chart illustrating a method of performing simulated annealing of a design for a programmable logic device in accordance with the inventive arrangements disclosed herein.

FIG. 1 is a flow chart illustrating a method 100 of performing simulated annealing of a design for a programmable logic device (PLD) in accordance with the inventive arrangements disclosed herein. The method 100 can be performed by a software-based PLD design tool operating within a suitable information processing or computer system. In one embodiment, the design tool can be configured to operate upon designs for field programmable gate arrays (FPGA's).

The method 100 can begin in step 105 where a netlist or other circuit representation specifying PLD logic functions is loaded into the design tool. A starting configuration for the design can be determined, for example at random, to serve as a baseline for the simulated annealing process. In step 110, the parameters for simulated annealing can be initialized. These parameters can include, but are not limited to, those parameters specific to a cooling schedule such as an initial temperature and a final temperature.

In step 115, each movable object can be associated with a criticality measure. As simulated annealing can be performed on a limited basis for selected components or component groups, a movable object refers to the type of component or component grouping that is to be annealed. As noted, simulated annealing can be used to perform partitioning, floorplanning, and placement for PLD's. Accordingly, it should be appreciated that a movable object can include, but is not limited to, individual components, groups of more than one component, a logic block, and/or a module.

The criticality measure is a function, denoted as Crit(i), that can utilize object type, group connectivity, group shape, number of elements in a group, other user constraints, as well as timing information as parameters. Timing information for the design can include, but is not limited to, the number of critical paths adjacent to a movable object, slack, and the like.

Critical paths are those paths that do not meet timing requirements specified for the design. Accordingly, the number of critical paths adjacent or proximate to an object can include those paths connecting to the object, whether inputs or outputs. Adjacent critical paths also can include critical paths located or passing within a particular area surrounding the object being evaluated.

The slack of a connection or path indicates the degree by which the connection/path meets, exceeds, or fails a target delay of the connection/path as specified by predetermined timing requirements. In illustration, a zero value indicates the timing constraint for a connection/path is met exactly, a negative slack indicates a failing connection/path, and a positive slack indicates a passing connection/path. The more negative the slack, the greater the degree by which the connection or path fails the target delay. The higher the value of a positive slack, the greater the degree by which the connection or path exceeds the target delay.

As the criticality measure can include parameters specific to the object type, the criticality measure need not be the same function for each type of object. While the criticality measure can be the same as or similar among one or more different object types, in another embodiment, the criticality measure can vary with each different object type. The criticality measure is independent of the cost function used to evaluate the quality of a proposed or new design configuration.

In one embodiment, the criticality measure can be Crit(i)= 1+mult*F(i), where $$F(i) = \sum_{j=1}^{N} f(i, j) * g(i, j).$$

Summation can be performed over all groups connected to group i, where f(i, j)=1−slack(i, j)/Max|Slack|, g(i, j)=n/M, n is the number of critical paths sharing connections between (i, j), and M is the total number critical paths.

The first term f can vary in the interval [0,2] and can be particularly large for a group with large negative slack on connections adjacent to the group. The second term g, can vary in the interval [0,1]. The term g stresses groups that have many critical paths adjacent to the group. According to this embodiment, different group types have different criticality due to the different number of terms in the summation, the different number of critical paths, and the different slacks.

The multiplier mult facilitates control of critical criticality contribution. That is, if mult=0, then Crit(i)=1 and the probability of selection is uniform where Pr(i)=1/N . If mult is very large, the probability distribution is largely skewed. For groups with large F(i), Pr(i) is close to 1 so that the group will be selected most of the time.

In step 120, timing information can be determined for the current configuration or state of the design. That is, the design tool can perform an analysis upon the design to determine the timing information. In the first iteration of the simulated annealing process, the timing analysis is performed upon the baseline or initial configuration of the design.

In step 125, the criticality measure can be calculated for each movable object. The probability distribution for the movable objects can be calculated in step 130. The probability for each movable object (i) can be represented as:

$$Pr(i) = \frac{Crit(i)}{\sum_{i=1}^{N} Crit(i)}.$$

As can be seen from this relationship, summing over all probabilities yields a value of 1. Notably, the smaller the criticality for a movable object, the lower the probability that the movable object will be selected for controlled move generation during an iteration of the simulated annealing process. The larger the criticality, the larger the probability of being selected.

One or more movable objects can be selected for moving and/or displacement to be performed as an iteration of the simulated annealing process in step 135. The selection of an object for controlled move generation can be based upon the calculated probabilities, or probability distribution, of the movable objects. Thus, objects with a higher criticality, or higher probability of selection, will be selected more frequently. In illustration, when the probability distribution is chosen, a random selection based on probability distribution is performed. If the number of moves allowed per iteration was limited to 1,000, and there are two groups with a probability of 0.6 and 0.4 respectively, then the first group will be selected an average of 600 times, while the second group will be chosen an average of 400 times.

In step 140, a target location for each movable object selected in step 135 can be selected. Each selected object can be moved, or reassigned, to an associated target location in step 145. In step 150, a cost function can be calculated to evaluate the quality of the proposed move, or new design configuration. The new configuration is accepted if the cost function improves over the last iteration, or is accepted with a probability that is dependent upon the temperature in step 155.

In step 160, a determination can be made as to whether a predetermined number of iterations have been determined for the current phase of simulated annealing. If so, the method can proceed to step 165. If not, the method can loop back to step 135 to continue processing until the designated number of iterations has been reached.

In step 165, having performed the desired number of iterations, the temperature can be adjusted according to the cooling schedule. The temperature can be adjusted downwardly to simulate cooling, thereby restricting the number of moves, and thus configurations, that will be accepted. In step 170, a determination can be made as to whether a stopping criteria has been met. The stopping criteria can be the temperature dropping to a particular temperature or the cost function yielding a value that has improved by a particular percentage or that falls within a particular range. If the stopping criteria has not been met, the method can loop back to step 120 to repeat as necessary.

Typically, the cost function associated with physical layout can be represented generically as: Cost=y(wirelength)+ C*y(timing), where C is the relative weight of the timing contribution to the wirelength contribution. It should be appreciated that at different phases of simulated annealing, one may wish to emphasize the first or the second contribution of the cost function. The formulation of a policy for changing C according to user preferences can be problematic. Criticality based selection, however, can effectively overcome the problem of dynamic adjustment of C.

The control parameter mult, discussed with reference to the criticality function, can facilitate a greater degree of control over the annealing process. More particularly, at early stages of annealing, the multiplier can be kept high to enforce or favor selection of timing critical groups. After some number of iterations, when a substantial number of, or most, timing improvement moves have been explored, the multiplier can be reduced thereby favoring selection of groups that improve wirelength.

The opposite effect also can be achieved. That is, the multiplier can be kept low to favor wirelength improvement in earlier stages of simulated annealing. At later or final stages of the simulated annealing process, the multiplier can be increased to favor timing improvement moves.

The inventive arrangements disclosed herein provide a solution for move-set design used in simulated annealing techniques. The inventive arrangements modify the probability of selecting a particular movable object based upon a measure of criticality of the objects. More particularly, the probability of a particular object being selected is dependent upon the criticality of the object with respect to design constraints. This facilitates the selection and movement of those objects that are most likely to affect the design. The use of criticality measures further is independent of the cost function.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of physical design for a programmable logic device comprising:
    (a) associating movable objects of the programmable logic device with a criticality measure that is dependent upon timing information for a configuration of the programmable logic device, wherein movable objects are components of a circuit design that are to be annealed;
    (b) calculating the criticality measure for each movable object;
    (c) calculating a probability for each movable object, wherein the probability is dependent upon the criticality measure for the movable object; and
    (d) selecting at least one of the movable objects for movement within an iteration of a simulated annealing process according to the probabilities of the movable objects, wherein the simulated annealing process implements the circuit design for the programmable logic device.

2. The method of claim 1, further comprising:
    (e) performing a movement of the at least one movable objects to generate a new configuration of the programmable logic device;
    (f) determining timing information for the new configuration of the programmable logic device; and
    performing said steps (b), (c), and (d) using the timing information for the new configuration.

3. The method of claim 1, wherein the criticality measure is determined according to a type of a movable object.

4. The method of claim 1, wherein the criticality measure further depends upon at least one of a shape of a movable object and a number of circuit design components in a movable object.

5. The method of claim 1, wherein the criticality measure is determined according to a number of critical paths adjacent to a movable object.

6. The method of claim 1, wherein the criticality measure includes a measure of timing delay.

7. The method of claim 1, wherein the criticality measure, denoted as Crit(i), is independent of a cost function used during the simulated annealing process and is determined according to Crit(i)=1+mult*F(i), wherein $$F(i) = \sum_{j=1}^{N} f(i, j) * g(i, j),$$

wherein summation is performed over all movable objects connected to a moveable object i, wherein f(i, j)=1−slack(i, j)/Max|Slack| and g(i, j)=n/M, wherein n is the number of critical paths sharing connections between (i,j), and M is the total number of critical paths.

8. The method of claim 1, wherein the criticality measure selectively favors a selection of movable objects that improve wirelength or timing.

9. A machine readable storage, having stored thereon a computer program having a plurality of code sections executable by a machine for causing the machine to perform the steps of:
  (a) associating movable objects of a programmable logic device with a criticality measure that is dependent upon timing information for a current configuration of the programmable logic device, wherein movable objects are components of a circuit design that are to be annealed;
  (b) calculating the criticality measure for each movable object;
  (c) calculating a probability for each movable object, wherein the probability is dependent upon the criticality measure for the movable object; and
  (d) selecting at least one of the movable objects for movement within an iteration of a simulated annealing process according to the probabilities of the movable objects, wherein the simulated annealing process implements the circuit design for the programmable logic device.

10. The machine readable storage of claim 9, further comprising:
  (e) performing a movement of the selected at least one movable objects to generate a new configuration of the programmable logic device;
  (f) determining timing information for the new configuration of the programmable logic device; and
  performing said steps (b), (c), and (d) using the timing information for the new configuration.

11. The machine readable storage of claim 9, wherein the criticality measure is determined according to a type of a movable object.

12. The machine readable storage of claim 9, wherein the criticality measure further depends upon at least one of a shape of a movable object and a number of circuit design components in a movable object.

13. The machine readable storage of claim 9, wherein the criticality measure is determined according to a number of critical paths adjacent to a movable object.

14. The machine readable storage of claim 9, wherein the criticality measure includes a measure of timing delay.

15. The machine readable storage of claim 9, wherein the criticality measure, denoted as Crit(i), is independent of a cost function used during the simulated annealing process and is determined according to Crit(i)=1+mult*F(i), wherein $$F(i) = \sum_{j=1}^{N} f(i, j) * g(i, j),$$

wherein summation is performed over all movable objects connected to a moveable object i, wherein f(i, j)=1−slack(i, j)/Max|Slack| and g(i, j)=n/M, wherein n is the number of critical paths sharing connections between (i,j), and M is the total number of critical paths.

16. The machine readable storage of claim 9, wherein the criticality measure selectively favors a selection of movable objects that improve wirelength or timing.

17. A system for physical design of a programmable logic device comprising:
  (a) means for associating movable objects of the programmable logic device with a criticality measure that is dependent upon timing information for a configuration of the programmable logic device, wherein movable objects are components of a circuit design that are to be annealed;
  (b) means for calculating the criticality measure for each movable object;
  (c) means for calculating a probability for each movable object, wherein the probability is dependent upon the criticality measure for the movable object; and
  (d) means for selecting at least one of the movable objects for controlled movement within an iteration of a simulated annealing process according to the probabilities of the movable objects, wherein the simulated annealing process implements the circuit design for the programmable logic device.

18. The system of claim 17, further comprising:
  (e) means for performing a movement of the at least one movable objects to generate a new configuration of the programmable logic device;
  (f) means for determining timing information for the new configuration of the programmable logic device; and
  means for causing said means (b), (c), and (d) to operate for at least one subsequent iteration using the timing information for the new configuration.

19. The system of claim 17, wherein the criticality measure, denoted as Crit(i), is independent of a cost function used during the simulated annealing process and is determined according to Crit(i)=1+mult*F(i), wherein $$F(i) = \sum_{j=1}^{N} f(i, j) * g(i, j),$$

wherein summation is performed over all movable objects connected to a moveable object i, wherein f(i, j)=1−slack(i, j)/Max|Slack| and g(i, j)=n/M, wherein n is the number of critical paths sharing connections between (i,j), and M is the total number of critical paths.

* * * * *